US008778599B2

(12) United States Patent
Uohashi et al.

(10) Patent No.: US 8,778,599 B2
(45) Date of Patent: Jul. 15, 2014

(54) METHOD OF PRODUCING INK EJECTION HEAD

(71) Applicant: Canon Kabushiki Kaisha, Tokyo (JP)

(72) Inventors: Kunihito Uohashi, Yokohama (JP); Kazuhiro Asai, Kawasaki (JP); Keiji Matsumoto, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/067,012

(22) Filed: Oct. 30, 2013

(65) Prior Publication Data

US 2014/0141379 A1 May 22, 2014

(30) Foreign Application Priority Data

Nov. 21, 2012 (JP) ................................ 2012-255201

(51) Int. Cl.
*B41J 2/16* (2006.01)
*G03F 7/20* (2006.01)

(52) U.S. Cl.
USPC ........................................................ 430/320

(58) Field of Classification Search
None
See application file for complete search history.

(56) References Cited

U.S. PATENT DOCUMENTS

| | | | | |
|---|---|---|---|---|
| 6,162,589 | A * | 12/2000 | Chen et al. | 430/320 |
| 6,709,805 | B1 * | 3/2004 | Patil | 430/320 |
| 2007/0059531 | A1 * | 3/2007 | Park et al. | 428/413 |
| 2009/0091600 | A1 * | 4/2009 | Fannin et al. | 347/45 |
| 2012/0047736 | A1 * | 3/2012 | Horiuchi | 29/890.1 |
| 2013/0330673 | A1 | 12/2013 | Uohashi et al. | |

FOREIGN PATENT DOCUMENTS

| | | |
|---|---|---|
| JP | 2007-320299 A | 12/2007 |

* cited by examiner

*Primary Examiner* — John A. McPherson
(74) *Attorney, Agent, or Firm* — Fitzpatrick, Cella, Harper & Scinto

(57) ABSTRACT

Provided is a method of producing an ink ejection head including a substrate, an ink ejection energy-generating element, a flow path-forming member, and an ejection orifice-forming member having an ink ejection orifice, the ink ejection orifice having, on a side open to an outside, a portion whose sectional area is constant and a portion whose sectional area increases from the portion to an ink ejection energy-generating element side, the method including: forming, on the substrate, a first negative photosensitive resist; forming, on the first negative photosensitive resist, a second negative photosensitive resist; partially mixing the first negative photosensitive resist and the second negative photosensitive resist to form a compatible layer; and subjecting the second negative photosensitive resist and the compatible layer to collective exposure and development to form the ink ejection orifice.

10 Claims, 2 Drawing Sheets

METHOD OF PRODUCING INK EJECTION HEAD

BACKGROUND OF THE INVENTION

1. Field of the Invention

The present invention relates to a method of producing an ink ejection head.

2. Description of the Related Art

A typical example of a liquid droplet ejection head that ejects a liquid droplet is an ink ejection head to be applied to an inkjet recording system that ejects ink to a recording medium to perform recording. The ink ejection head generally includes an ink ejection orifice for ejecting the ink, a liquid chamber and an ink flow path communicating with the ink ejection orifice, and an energy-generating portion provided in the liquid chamber.

The ink ejection head performs recording by driving the energy-generating portion to eject an ink droplet from the ink ejection orifice. Accordingly, the size and shape of the ink ejection orifice affect ink ejection performance. In recent years, miniaturization of the ink ejection head has been progressing and an ultrafine ink ejection orifice capable of ejecting 5 pl or less of ink has been mounted on the ink ejection head.

However, when ink is stopped from being ejected over a long time period, a solvent in the ink vaporizes, and hence the ink thickens or solidifies to clog the inside of a fine ink ejection orifice in some cases. Accordingly, in order that ink having a high viscosity may be stably ejected, resistance of the ink at the time of its ejection needs to be reduced. The following has been known as one means for solving the problem. The ink ejection orifice is provided with a shape whose sectional area increases from an ink ejection orifice side to an ink ejection energy-generating element side (hereinafter referred to as "tapered shape").

Japanese Patent Application Laid-Open No. 2007-320299 discloses a method of producing an ink ejection head having an ink ejection orifice of a tapered shape. A nozzle-forming member (hereinafter referred to as "nozzle") formed of a negative photosensitive resist is applied onto a liquid chamber and flow path wall-molding material formed on a substrate. The nozzle has a two-layer structure and a latent image of a tapered shape is formed at the time of exposure by adding a light-absorbing material to a lower layer. An upper layer has sensitivity with which a latent image having constant dimensions with respect to mask dimensions at the time of the exposure can be formed. After the two layers have been stacked, collective exposure and development are performed. Thus, the ink ejection head having an ink ejection orifice of a tapered shape is obtained.

SUMMARY OF THE INVENTION

A method of producing an ink ejection head according to the present invention is a method of producing an ink ejection head including a substrate, an ink ejection energy-generating element provided on the substrate, a flow path-forming member for forming an ink flow path, the member being provided on the substrate, and an ejection orifice-forming member having an ink ejection orifice at a position opposite to the ink ejection energy-generating element, the ink ejection orifice having, on a side open to an outside, a portion whose sectional area is constant and a portion whose sectional area increases from the portion to an ink ejection energy-generating element side, the method including: forming, on the substrate, a first negative photosensitive resist serving as the flow path-forming member; forming, on the first negative photosensitive resist, a second negative photosensitive resist serving as the ejection orifice-forming member; partially mixing the first negative photosensitive resist and the second negative photosensitive resist to form a compatible layer; and subjecting the second negative photosensitive resist and the compatible layer to collective exposure and development to form the ink ejection orifice.

Further features of the present invention will become apparent from the following description of exemplary embodiments with reference to the attached drawings.

DESCRIPTION OF THE EMBODIMENTS

In the method described in Japanese Patent Application Laid-Open No. 2007-320299, the light-absorbing material needs to be added to the negative photosensitive resist of the lower layer for forming an ink ejection orifice of a tapered shape. Meanwhile, the negative photosensitive resist of the lower layer serves as a surface in close contact with the substrate, and hence the following problem arises: adhesiveness between the nozzle and the substrate reduces owing to an insufficient exposure amount. When the entire exposure amount is increased for solving the problem, it becomes difficult to form an ultrafine ink ejection orifice. On the other hand, when only the surface in close contact with the substrate is additionally exposed, the number of steps increases and hence productivity reduces.

An object of the present invention is to provide a method of producing an ink ejection head by which an ink ejection orifice of a tapered shape can be easily formed while adhesiveness between a nozzle and a substrate is secured.

(Ink Ejection Head)

Figure 3:
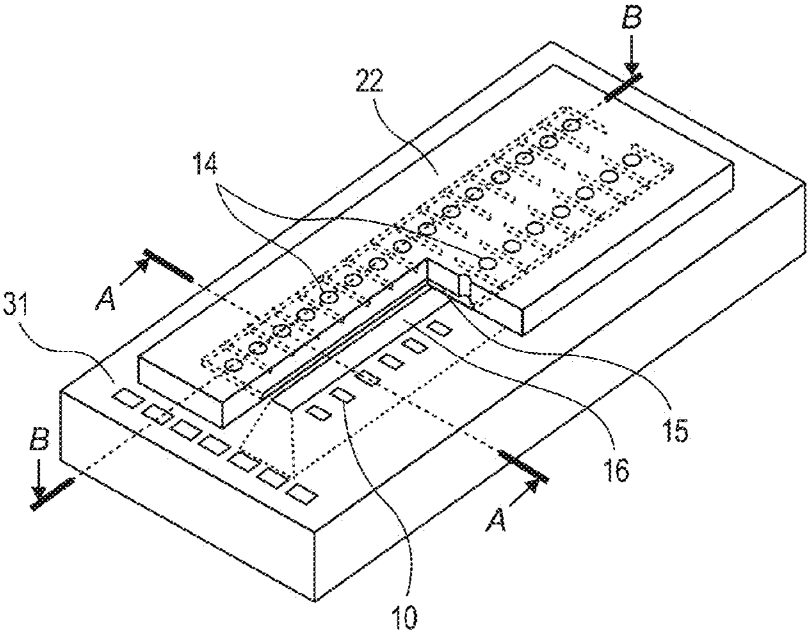
FIG. 3 is a perspective view illustrating an example of the ink ejection head according to the present invention.
Figure 4:
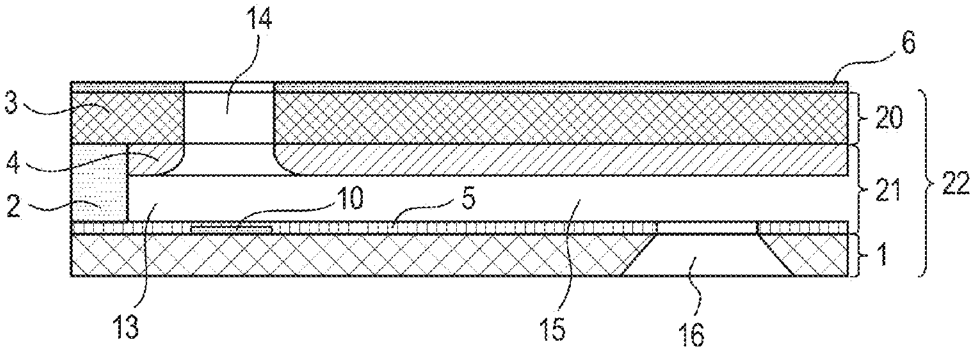
FIG. 4 is a sectional view illustrating an example of the ink ejection head according to the present invention.

FIG. 3 is a perspective view illustrating an example of an ink ejection head according to the present invention. FIG. 4 is an A-A sectional view of the ink ejection head of FIG. 3.

As illustrated in FIG. 4, an ink ejection head 22 includes a substrate 1, a flow path-forming member 21 for forming an ink flow path 15, and an ejection orifice-forming member 20 having an ink ejection orifice 14. The substrate 1 includes an ink ejection energy-generating element 10 and has an ink supply port 16 formed therein. The surface of the ejection orifice-forming member 20 is provided with a water-repellent film 6. The ink ejection orifice 14 has a portion whose opening has a constant sectional area and a portion whose opening has a sectional area that increases from the portion to the ink ejection energy-generating element 10 side. The flow path-forming member 21 forms a liquid chamber 13 for holding ink and the ink flow path 15.

(Method of Producing Ink Ejection Head)

A method of producing an ink ejection head according to the present invention is a method of producing an ink ejection head including a substrate, an ink ejection energy-generating element provided on the substrate, a flow path-forming member for forming an ink flow path, the member being provided on the substrate, and an ejection orifice-forming member having an ink ejection orifice at a position opposite to the ink ejection energy-generating element, the ink ejection orifice having, on a side open to an outside, a portion whose sectional area is constant and a portion whose sectional area increases from the portion to an ink ejection energy-generating element side, the method including: forming, on the substrate, a first negative photosensitive resist serving as the flow path-forming member; forming, on the first negative photosensitive resist, a second negative photosensitive resist serving as the ejection orifice-forming member; partially mixing the first negative photosensitive resist and the second negative photosensitive resist to form a compatible layer; and subjecting the second negative photosensitive resist and the compatible layer to collective exposure and development to form the ink ejection orifice.

The method according to the present invention eliminates the need for the addition of a light-absorbing material to the first negative photosensitive resist serving as the flow path-forming member in close contact with the substrate, and hence enables the exposure of the first negative photosensitive resist with a proper exposure amount. Thus, a high-reliability ink ejection head having high adhesiveness between the flow path-forming member constituting a nozzle and the substrate, and having an ink ejection orifice of a tapered shape can be obtained.

The method of producing an ink ejection head according to the present invention is described with reference to FIG. 1 and FIGS. 2A to 2G. FIG. 1 and FIGS. 2A to 2G each illustrate part of a B-B sectional view of the ink ejection head illustrated in FIG. 3 (a portion corresponding to the ink ejection orifices 14). It is to be noted that the method according to the present invention is not limited thereto.

Figure 1:
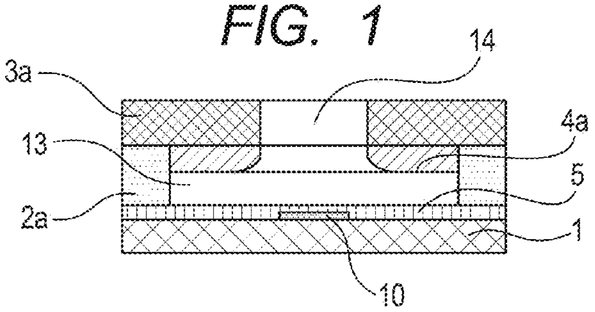
FIG. 1 is a sectional view illustrating an example of an ink ejection head according to the present invention.
Figure 2A:
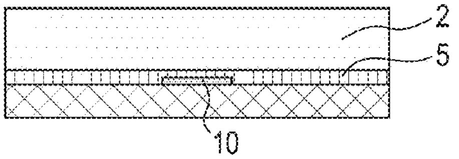
FIGS. 2A, 2B, 2C, 2D, 2E, 2F and 2G are sectional views illustrating an example of a method of producing the ink ejection head according to the present invention.

First, as illustrated in FIG. 2A, a first negative photosensitive resist 2 is formed on the substrate 1 formed of silicon on which the ink ejection energy-generating element 10 and a protective layer 5 have been formed. Examples of the ink ejection energy-generating element 10 include a thermoelectric conversion element and a piezoelectric element. $SiO_2$ or the like can be used as a material for the protective layer 5. A chemical amplification type resist can be used as the first negative photosensitive resist 2. An epoxy resin, a silicone-based polymer compound, a vinyl-based polymer compound having a hydrogen atom at an α-position, or the like can be used as a resin component in the first negative photosensitive resist 2. Of those, the epoxy resin is preferred as the resin component. Examples of the epoxy resin include a phenolic novolac resin, a cresol novolac resin, and an epoxidized rubber such as an epoxidized polybutadiene. Only one kind of those resins may be used, or two or more kinds thereof may be used in combination. In addition, the first negative photosensitive resist 2 can contain a photoacid generator. A triarylsulfonium salt, an onium salt, or the like can be used as the photoacid generator. Only one kind of those salts may be used, or two or more kinds thereof may be used in combination. Further, the first negative photosensitive resist 2 can contain a solvent. Propylene glycol monomethyl ether acetate (hereinafter referred to as "PGMEA"), γ-butyrolactone, or the like can be used as the solvent. Only one kind of those solvents may be used, or two or more kinds thereof may be used in combination. The boiling point of the solvent is preferably 100° C. or more and 250° C. or less. It is to be noted that the boiling point in the present invention is a literature value. In addition, the solvent may be identical to a solvent in a second negative photosensitive resist 3 to be described later or a solvent 12 to be applied onto the second negative photosensitive resist.

The ratio of the resin component in the first negative photosensitive resist 2 can be set to, for example, 19.9 mass % or more and 70.0 mass % or less. The ratio of the photoacid generator in the first negative photosensitive resist 2 can be set to, for example, 0.1 mass % or more and 2.5 mass % or less. The ratio of the solvent in the first negative photosensitive resist 2 can be set to, for example, 29.9 mass % or more and 80.0 mass % or less.

A method of forming the first negative photosensitive resist 2 is, for example, a solvent coating method or a method involving producing a dry film and transferring the film onto a substrate. The solvent coating method is a method involving: applying a resist solution onto a substrate with a spin coater, a roll coater, a wire bar, or the like; and removing the solvent through drying after the application to form a resist layer. The first negative photosensitive resist 2 can be formed by, for example, applying a solution containing the resin component, the photoacid generator, and the solvent onto the substrate 1 by a spin coating method, and drying the solution. The thickness of the first negative photosensitive resist 2, which is not particularly limited, can be set to, for example, 5 μm or more and 30 μm or less.

The solubility parameter (SP value) of the first negative photosensitive resist 2 is preferably 5 or more and 13 or less. It is to be noted that the SP value in the present invention is a value estimated from a physical property value. Specifically, a solubility parameter δ can be estimated by citing the physical property value of each material from a literature because the δ is defined as follows: $\delta=\sqrt{(\Delta H-RT)/V}$ where LH represents enthalpy of vaporization and V represents a molar volume.

Figure 2B:
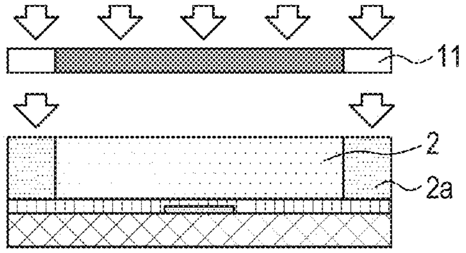

Next, as illustrated in FIG. 2B, a latent image of an ink flow path pattern is formed by selectively exposing the first negative photosensitive resist 2 through a mask, and then post exposure bake (hereinafter referred to as "PEB") is performed. Thus, a first negative photosensitive resist (cured portion) 2*a* is formed. UV light, ionizing radiation, or the like can be used in the exposure. An exposure amount can be set to, for example, 3,000 $J/m^2$ or more and 10,000 $J/m^2$ or less, though the amount is not particularly limited as long as a desired pattern can be formed. The PEB can be performed, for example, at 40° C. or more and 105° C. or less for 3 minutes or more and 15 minutes or less, though the temperature and the time period are also not particularly limited as long as the desired pattern can be formed.

Figure 2C:
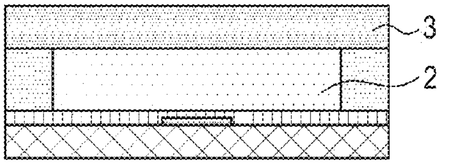

Next, as illustrated in FIG. 2C, the second negative photosensitive resist 3 is formed on the first negative photosensitive resist 2. A chemical amplification type resist can be used as the second negative photosensitive resist 3. The same resin component as the resin component in the first negative photosensitive resist 2 can be used as a resin component in the second negative photosensitive resist 3. In addition, the second negative photosensitive resist 3 can contain a photoacid generator. The photoacid generator is not particularly limited as long as a desired pattern can be formed, and the same photoacid generator as the photoacid generator in the first negative photosensitive resist 2 can be used. Further, the second negative photosensitive resist 3 can contain a solvent. PGMEA, γ-butyrolactone, or the like can be used as the solvent. Only one kind of those solvents may be used, or two or more kinds thereof may be used in combination. The boiling point of the solvent is preferably 100° C. or more and 250° C. or less. It is to be noted that the solvent may be identical to a solvent in the first negative photosensitive resist 2 or the solvent 12 to be applied onto the second negative photosensitive resist 3 to be described later.

The ratio of the resin component in the second negative photosensitive resist 3 can be set to, for example, 19.9 mass % or more and 70.0 mass % or less. The ratio of the photoacid generator in the second negative photosensitive resist 3 can be set to, for example, 0.1 mass % or more and 2.5 mass % or less. The ratio of the solvent in the second negative photosensitive resist 3 can be set to, for example, 29.9 mass % or more and 80.0 mass % or less.

In the present invention, the sensitivity of the second negative photosensitive resist 3 to exposure is preferably higher than the sensitivity of the first negative photosensitive resist 2 to exposure from the viewpoint of the adjustment of the sensitivity of a compatible layer 4 to be described later. That is, the second negative photosensitive resist 3 preferably contains a larger amount of the photoacid generator than that of the first negative photosensitive resist 2.

A method of forming the second negative photosensitive resist 3 is, for example, a solvent coating method or a method involving producing a dry film and transferring the film onto a substrate. However, the method involving producing the dry film and transferring the film onto the substrate is preferred from, for example, the following viewpoint: in the case of application by the solvent coating method, the solvent in the resist 3 dissolves the resist 2.

The thickness of the second negative photosensitive resist 3, which is not particularly limited, can be set to, for example, 3 μm or more and 60 μm or less.

Figure 2D:
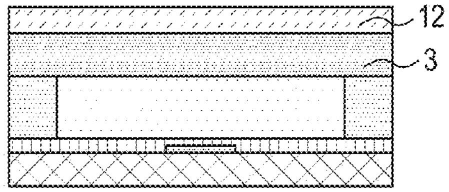

Next, as illustrated in FIG. 2D, the solvent 12 is applied onto the second negative photosensitive resist 3. Examples of the solvent 12 include PGMEA, γ-butyrolactone, toluene, α-terpineol, ethyl acetate, and acetone. Only one kind of those solvents may be used, or two or more kinds thereof may be used in combination. The SP value of the solvent 12 is preferably 5 or more and 13 or less. It is to be noted that the solvent 12 may be identical to the solvent in the first negative photosensitive resist 2 or the solvent in the second negative photosensitive resist 3.

The absolute value of a difference in SP value between the second negative photosensitive resist 3 and the solvent 12 is preferably 3.0 or less. When the absolute value of the difference in SP value is 3 or less, the solvent 12 permeates up to the first negative photosensitive resist 2, and the first negative photosensitive resist 2 and the second negative photosensitive resist 3 are partially mixed to form the compatible layer 4. The absolute value of the difference in SP value is more preferably 2.5 or less, still more preferably 2.0 or less. In addition, the absolute value of a difference in SP value between the first negative photosensitive resist 2 and the solvent 12 is preferably 3.0 or less.

The boiling point of the solvent 12 is preferably 220° C. or less. When the boiling point of the solvent 12 is 220° C. or less, a time period from the permeation of the solvent 12 into the second negative photosensitive resist 3 to the volatilization of the solvent 12 can be lengthened. Accordingly, the solvent 12 can be caused to sufficiently permeate the second negative photosensitive resist 3 and the first negative photosensitive resist 2, and hence the compatible layer 4 can be formed. The boiling point of the solvent 12 is more preferably 50° C. or more and 200° C. or less, still more preferably 70° C. or more and 150° C. or less.

In addition, the boiling point of the solvent 12 is preferably equal to or lower than the boiling point of the solvent in the second negative photosensitive resist 3 from the viewpoint of the control of the thickness of the compatible layer 4. The boiling point of the solvent 12 is lower than the boiling point of the solvent in the second negative photosensitive resist 3 by more preferably 10° C. or more, still more preferably 30° C. or more.

A method of applying the solvent 12, which is not particularly limited, is, for example, an application method involving using a slit coater or application by spin coating.

The thickness of the compatible layer 4 varies depending on, for example, the SP value of the solvent 12, the boiling point of the solvent 12, the application amount of the solvent 12, a time period from the completion of the application of the solvent 12 to its drying, and a condition for the drying. The application amount of the solvent 12 can be set to $1.0\times10^{-9}$ ml or more and $6.0\times10^{-9}$ ml or less per 1 $\mu m^2$. The time period from the completion of the application of the solvent 12 to its drying can be set to 15 to 60 seconds. The temperature at which the solvent 12 is dried can be set to 40° C. or more and 90° C. or less. The time period for which the solvent 12 is dried can be set to 3 minutes or more and 15 minutes or less.

Figure 2E:
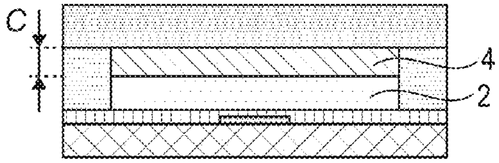

When the solvent 12 permeates the second negative photosensitive resist 3 and the first negative photosensitive resist 2, the first negative photosensitive resist 2 and the second negative photosensitive resist 3 are partially mixed to form the compatible layer 4 as illustrated in FIG. 2E. A thickness C of the compatible layer 4 is preferably 0.5 μm or more and 30.0 μm or less, more preferably 3.0 μm or more and 10.0 μm or less from the following viewpoint: an ink ejection orifice of a tapered shape can be easily formed.

Although the solvent 12 may be applied onto the second negative photosensitive resist 3 without being treated, a third material containing the solvent 12 may be applied. The third material preferably has water repellency. Thus, a water-repellent film can be formed on the second negative photosensitive resist 3 simultaneously with the formation of the compatible layer 4. In addition, the water repellency of the water-repellent film is comparable to that of a water-repellent film formed by applying the third material free of the solvent 12. A fluorine-based water-repellent agent, a silicon-based water-repellent agent, or the like can be used as a water-repellent agent in the third material. Only one kind of those agents may be used, or two or more kinds thereof may be used in combination. The thickness of the water-repellent film is preferably 0.1 μm or more and 1.0 μm or less.

The ratio of the solvent 12 in the third material is preferably 5 mass % or more and 70 mass % or less. When the ratio is 5 mass % or more, the solvent 12 permeates to result in the formation of the compatible layer 4. In addition, when the ratio is 70 mass % or less, the shape of an ink ejection orifice is maintained and hence an ink ejection orifice of a tapered shape can be formed. The ratio is more preferably 20 mass % or more and 60 mass % or less, still more preferably 30 mass % or more and 50 mass % or less.

It is to be noted that a method of forming the compatible layer 4 is not limited to the method based on the permeation of the solvent 12. For example, the compatible layer 4 can be formed with heat. Upon transfer of the second negative photosensitive resist 3 onto the first negative photosensitive resist 2, a transfer temperature (temperature to be applied to each resist) is set to the temperature at which the first negative photosensitive resist 2 and the second negative photosensitive resist 3 are sufficiently softened. Specifically, when it is assumed that a general epoxy resin is used in each resist, the temperature is preferably 30° C. or more, more preferably 50° C. or more, and is preferably 180° C. or less, more preferably 120° C. or less. The heat of the transfer is used to soften the first negative photosensitive resist 2 and the second negative photosensitive resist 3 as described above, and further, a pressure is applied to mix the two resists, whereby the compatible layer 4 is formed. The method can suppress the dissolution of the first negative photosensitive resist 2 by the solvent in the second negative photosensitive resist 3 because the method does not involve the use of the solvent 12.

Also available as the method of forming the compatible layer 4 is, for example, a method involving utilizing a residual solvent in a resist. Herein, the amount of the residual solvent means the mass % of the solvent in the resist with respect to the entirety of the resist. Specifically, in the step illustrated in FIG. 2C, the amount of the residual solvent in each of the first negative photosensitive resist 2 and the second negative photosensitive resist 3 before the transfer of the second negative photosensitive resist 3 is adjusted to 5 mass % or more and 20 mass % or less. The adjustment is performed by adjusting, for example, a drying condition. When the transfer is performed in a state where the residual solvent sufficiently remains in each resist as described above, the first negative photosensitive resist 2 and the second negative photosensitive resist 3 are mixed to form the compatible layer 4.

After the compatible layer 4 has been formed as described above, as illustrated in FIG. 2F, a latent image of an ink ejection orifice pattern is formed by selectively subjecting the second negative photosensitive resist 3 and the compatible layer 4 to collective exposure through a mask, and then PEB is performed. When the third material containing the solvent 12 is applied, the third material is also subjected to the collective exposure. A condition for the exposure and a condition for the PEB are not particularly limited as long as a desired ink ejection orifice pattern can be formed. When the compatible layer 4 has lower sensitivity than that of the second negative photosensitive resist 3, an ink ejection orifice of a tapered shape is formed in subsequent development by performing the exposure under a proper exposure condition. UV light, ionizing radiation, or the like can be used in the exposure. An exposure amount can be set to, for example, 400 J/m$^2$ or more and 2,000 J/m$^2$ or less. With regard to a temperature and time period for the PEB, the PEB can be performed, for example, at 70° C. or more and 105° C. or less for 3 minutes or more and 10 minutes or less.

Figure 2F:
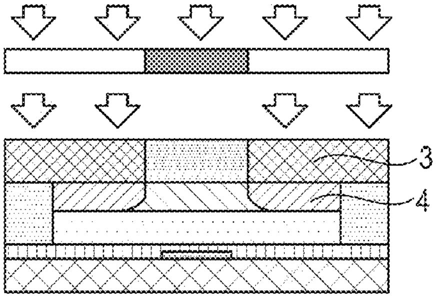
Figure 2G:
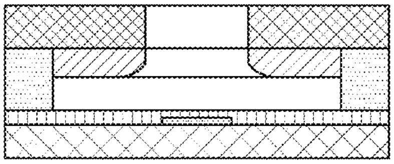

Next, as illustrated in FIG. 2G, an ink flow path and an ink ejection orifice are formed by subjecting the first negative photosensitive resist 2, the second negative photosensitive resist 3, and the compatible layer 4 to collective development. When the third material containing the solvent 12 is applied, the third material is also subjected to the collective development. The development can be performed by using propylene glycol monomethyl ether acetate (PGMEA) or the like. Thus, an ink ejection orifice of a tapered shape is formed, which has, on a side open to the outside, a portion whose sectional area is constant and a portion whose sectional area increases from the portion to the ink ejection energy-generating element side. Adhesiveness between the flow path-forming member and the substrate is also good. The taper angle of the ink ejection orifice is preferably 3° or more and 30° or less.

Next, an ink supply port is formed in the substrate 1, and then the substrate 1 is cut and separated with a dicing saw or the like into a chip. After that, electrical bonding for driving the ink ejection energy-generating element 10 is performed. Further, a chip tank member for ink supply is connected. Thus, an ink ejection head is completed.

In the method according to the present invention, when the solvent 12 is applied onto the second negative photosensitive resist 3, the solvent 12 permeates up to the first negative photosensitive resist 2 and hence the compatible layer 4 is formed between the two layers. The ejection orifice-forming member having an ink ejection orifice of a tapered shape can be formed without any reduction in adhesiveness between the flow path-forming member and the substrate 1 by utilizing the fact that the compatible layer 4 has lower sensitivity than that of the second negative photosensitive resist 3.

In addition, the ink ejection head formed by the method according to the present invention can stably eject even ink having a high viscosity because a front resistance at the time of the ejection of the ink is reduced.

Example 1

A method of producing an ink ejection head according to Example 1 is described with reference to FIGS. 2A to 2G. FIGS. 2A to 2G are sectional views illustrating the method of producing an ink ejection head according to this example.

First, as illustrated in FIG. 2A, the first negative photosensitive resist 2 (hereinafter referred to as "resist 2") was formed on the substrate 1. A silicon substrate was used as the substrate 1. The substrate 1 is provided with the ink ejection energy-generating element 10 that is a thermoelectric conversion element and the protective layer 5 containing $SiO_2$. The resist 2 was formed by: applying a solution containing a resin component formed of an epoxy resin (trade name: SU-8, manufactured by Nippon Kayaku Co., Ltd.), a solvent formed of PGMEA, a photoacid generator formed of a triarylsulfonium salt, and an acid deactivator formed of an amine compound by a spin coating method; and drying the solution. The thickness of the resist 2 was 8 μm. The ratio of the resin component in the resist 2 was 60 mass %, the ratio of the photoacid generator therein was 0.75 mass %, the ratio of the acid deactivator therein was 0.25 mass %, and the ratio of the solvent therein was 39 mass %. That is, the amount of the residual solvent of the resist 2 is 39 mass %. In addition, the softening point of the resist 2 was about 70° C.

Next, as illustrated in FIG. 2B, the resist 2 was selectively exposed to an ink flow path pattern through a mask 11, and then post exposure bake (PEB) was performed. UV light was used in the exposure. An exposure amount was set to 10,000 (J/m$^2$). The PEB was performed at 60° C. for 10 minutes.

Next, as illustrated in FIG. 2C, the second negative photosensitive resist 3 (hereinafter referred to as "resist 3") was formed on the resist 2. The resist 3 is a resist containing a resin component formed of an epoxy resin (identical to that of the resist 2), a solvent formed of PGMEA, and a photoacid generator formed of a triarylsulfonium salt. The ratio of the resin component in the resist 3 was 50 mass %, the ratio of the solvent therein was 49 mass %, and the ratio of the photoacid generator therein was 1 mass %. The resist 3 was formed into a dry film. The amount of the solvent of the resist 3 in a dry film state, i.e., the amount of the residual solvent was 0.1 mass %. In addition, the softening point of the resist 3 in a dry film state was about 70° C. The resist 3 was formed through dry film transfer by lamination. The transfer temperature was set to 55° C. and the transfer time was set to 1 minute. The thickness of the resist 3 was 8 μm. It is to be noted that in this example, the sensitivity of the resist 3 was set to be higher than the sensitivity of the resist 2 in order for the sensitivity of the compatible layer to be adjusted by making the resist 2 lowly sensitive and the resist 3 highly sensitive. That is, the resist 3 was caused to contain a larger amount of the photoacid generator than that of the resist 2. In addition, the SP value of the resist 3 was 9.7 to 10.9.

Next, as illustrated in FIG. 2D, the solvent 12 was applied onto the resist 3. PGMEA was used as the solvent 12. The solvent 12 was applied with a slit coater. The solvent 12 was applied under the following condition: $3.0\times10^{-9}$ ml of the solvent 12 was applied per 1 μm$^2$. A time period from the completion of the application of the solvent 12 to its drying was 40 seconds. The solvent 12 was dried at 60° C. for 10 minutes.

The solvent 12 sufficiently permeated the resist 3 because the absolute value of the difference in SP value between the resist 3 and the solvent 12 was 3 or less. As a result, the compatible layer 4 having a thickness C of 3 μm illustrated in FIG. 2E was formed.

Next, as illustrated in FIG. 2F, the resist 3 and the compatible layer 4 were selectively subjected to collective exposure to an ejection orifice pattern through a mask, and then PEB was performed. UV light was used in the exposure. An exposure amount was set to 1,000 (J/m$^2$). The PEB was performed at 105° C. for 10 minutes.

Next, as illustrated in FIG. 2G, the resist 2, the resist 3, and the compatible layer 4 were subjected to collective development. The development was performed by using PGMEA. Thus, an ink ejection orifice was formed, which had, on a side open to the outside, a portion whose sectional area was constant and a portion whose sectional area increased from the portion to the ink ejection energy-generating element side. The taper angle of the ink ejection orifice was 15°.

Next, an ink supply port was formed in the substrate 1. After that, the substrate 1 was cut and separated with a dicing saw into a chip, and then electrical bonding for driving the ink ejection energy-generating element 10 was performed. After that, a chip tank member for ink supply was connected. Thus, an ink ejection head was completed.

Example 2

An ink ejection head was produced in the same manner as in Example 1 with the exception that acetone was used instead of PGMEA as the solvent 12. The thickness C of the compatible layer 4 was 2.2 μm and an ink ejection orifice of a tapered shape having a taper angle of 10° was formed.

It is to be noted that acetone whose SP value is 10.0 has higher solubility than that of PGMEA whose SP value is 8.7. On the other hand, the boiling point of acetone is as low as 56.5° C. and its saturated vapor pressure at 20° C. is as high as 24.7 kPa. Accordingly, acetone is liable to volatilize even at low temperature as compared with PGMEA having a boiling point of 146° C. and a saturated vapor pressure at 20° C. of 3.8 kPa. Although acetone had high solubility, a time period from its permeation into the resist 3 to its volatilization was short. Accordingly, acetone volatilized before sufficient permeation and hence the thickness C of the compatible layer 4 was smaller than that of Example 1 using PGMEA.

Example 3

The steps illustrated in FIGS. 2A to 2C were performed in the same manner as in Example 1.

Next, a third material containing a solvent was applied onto the resist 3. A fluorine-based water-repellent agent was used as the third material. PGMEA was used as the solvent. The ratio of the solvent in the third material was set to 50 mass %. The third material was applied with a slit coater. The application amount of the third material was set so that the thickness of the water-repellent film 6 to be formed became less than 1 μm. A time period from the completion of the application of the third material to its drying was 40 seconds. The solvent 12 was dried at 60° C. for 10 minutes. The thickness of the water-repellent film 6 formed was 0.8 μm.

The subsequent steps were performed in the same manner as in Example 1. Thus, an ink ejection head was produced. The thickness C of the compatible layer 4 was 3 μm and an ink ejection orifice of a tapered shape having a taper angle of 15° was formed.

The water repellency of the water-repellent film 6 did not reduce even as compared with that in the case where the water-repellent agent was applied without the addition of any solvent. In addition, the compatible layer 4 having a thickness C of 3 μm was obtained. It was found that the compatible layer 4 was able to be formed without the reduction of the water repellency of the water-repellent film 6 even when the solvent 12 was added to the third material as described above.

Example 4

The steps illustrated in FIGS. 2A to 2C were performed in the same manner as in Example 1.

Next, a third material containing a solvent was applied onto the resist 3. The third material contains PGMEA as a solvent, and in addition, contains an epoxy resin (the same resin as the resin in the resist 3) and a photoacid generator (triarylsulfonium salt) as solid matter. The ratio of the solvent in the third material was set to mass %. The third material was applied with a slit coater. The application amount of the third material was set so that the thickness of a film to be formed became less than 1 μm. A time period from the completion of the application of the third material to its drying was 40 seconds. The third material was dried at 60° C. for 10 minutes. The thickness of the film formed was 1.0 μm.

The subsequent steps were performed in the same manner as in Example 1. Thus, an ink ejection head was produced. The thickness C of the compatible layer 4 was 3 μm and an ink ejection orifice of a tapered shape having a taper angle of 15° was formed.

In this example, a compatible layer is formed between the third material and the resist 3 as well in addition to the foregoing. Accordingly, a corner portion on a nozzle surface side of each of the ejection orifice pattern formed by the ejection orifice-forming member and the flow path-forming member, a stress relaxation pattern, and an end portion of a nozzle portion can be rounded. When the corner portion is rounded, the corner portion can be prevented from being brought into contact with a wiping mechanism at the time of the driving of the wiping mechanism, and hence the reliability of the nozzle can be improved.

The addition of the resin and the photoacid generator to the solvent as described above was able to result in the formation of: the compatible layer 4; and a high-reliability nozzle capable of preventing the corner portion from being brought into contact with the wiping mechanism by rounding the corner portion.

Example 5

The steps illustrated in FIGS. 2A and 2B were performed in the same manner as in Example 1.

Next, as illustrated in FIG. 2C, the second negative photosensitive resist 3 (hereinafter referred to as "resist 3") was formed on the resist 2. The same material as that of Example 1 was used as the resist 3. Subsequently, the resist 3 was formed on the resist 2. The resist 3 was formed through dry film transfer by lamination. However, a transfer temperature was set to 85° C., and a transfer time was set to 1 minute in the same manner as in Example 1.

In this example, the step of applying the solvent 12 of FIG. 2D was not performed, but the compatible layer 4 having a thickness C of 3 μm illustrated in FIG. 2E was formed. After that, an ink ejection head was completed in the same manner as in Example 1. The resultant inkjet recording head had an ink ejection orifice having, on a side open to the outside, a portion whose sectional area was constant and a portion whose sectional area increased from the portion to the ink ejection energy-generating element side. In addition, the taper angle of the ink ejection orifice was 15°.

Example 6

In this example, the amount of the residual solvent of the resist 2 was set to 6.0 mass % and the amount of the residual solvent of the resist 3 was set to 8.0 mass %. In addition, the step of applying the solvent 12 was not performed. An ink ejection head was completed in the same manner as in Example 1 except the foregoing. In this example, the compatible layer 4 having a thickness C of 1 μm illustrated in FIG. 2E was formed. The resultant inkjet recording head had an ink ejection orifice having, on a side open to the outside, a portion whose sectional area was constant and a portion whose sectional area increased from the portion to the ink ejection energy-generating element side. In addition, the taper angle of the ink ejection orifice was 3°.

Comparative Example 1

A dry film resist containing an epoxy resin having an SP value of 9.6 was used as the resist 3. In addition, ethanol having an SP value of 12.7 was used as the solvent 12. An ink ejection head was produced in the same manner as in Example 1 except the foregoing. In this comparative example, the compatible layer 4 was not formed because the solvent 12 did not permeate the resist 3. It was confirmed from the foregoing that the absolute value of the difference in SP value between the resist 3 and the solvent 12 needed to be 3 or more for forming the compatible layer 4.

Comparative Example 2

An ink ejection head was produced in the same manner as in Example 3 with the exception that the ratio of the solvent in the third material was set to 3 mass %. In this comparative example, the compatible layer 4 was not formed because the ratio of the solvent in the third material was low.

Example 5

An ink ejection head was produced in the same manner as in Example 3 with the exception that the ratio of the solvent in the third material was set to 5 mass %. In this example, the compatible layer 4 having a thickness C of 0.5 μm was formed and an ink ejection orifice of a tapered shape having a taper angle of 3° was able to be formed.

Example 6

An ink ejection head was produced in the same manner as in Example 3 with the exception that the ratio of the solvent in the third material was set to 70 mass %. In this example, the compatible layer 4 having a thickness C of 4.0 μm was formed and an ink ejection orifice of a tapered shape having a taper angle of 20° was able to be formed.

Comparative Example 3

An ink ejection head was produced in the same manner as in Example 3 with the exception that the ratio of the solvent in the third material was set to 75 mass %. In this comparative example, the shape of an ink ejection orifice collapsed and an ink ejection orifice of a tapered shape could not be formed because the ratio of the solvent in the third material was high.

It was confirmed from Examples 4 to 6, and Comparative Examples 2 and 3 that when the solvent 12 was added to the third material, the ratio of the solvent in the third material needed to be set to 5 mass % or more and 70 mass % or less for forming an ink ejection orifice of a tapered shape.

According to the present invention, it is possible to provide the method of producing an ink ejection head by which an ink ejection orifice of a tapered shape can be easily formed while adhesiveness between a nozzle and a substrate is secured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-255201, filed Nov. 21, 2012, which is hereby incorporated by reference herein in its entirety.

What is claimed is:

1. A method of producing an ink ejection head including a substrate, an ink ejection energy-generating element provided on the substrate, a flow path-forming member for forming an ink flow path, the member being provided on the substrate, and an ejection orifice-forming member having an ink ejection orifice at a position opposite to the ink ejection energy-generating element, the ink ejection orifice having, on a side open to an outside, a portion whose sectional area is constant and a portion whose sectional area increases from the portion to an ink ejection energy-generating element side, the method comprising:

forming, on the substrate, a first negative photosensitive resist serving as the flow path-forming member;

forming, on the first negative photosensitive resist, a second negative photosensitive resist serving as the ejection orifice-forming member;

partially mixing the first negative photosensitive resist and the second negative photosensitive resist to form a compatible layer; and subjecting the second negative photosensitive resist and the compatible layer to collective exposure and development to form the ink ejection orifice.

2. The method of producing an ink ejection head according to claim 1, wherein the method comprises:

forming, on the substrate, the first negative photosensitive resist through one of application and transfer;

selectively exposing the first negative photosensitive resist to form a latent image of an ink flow path pattern;

forming, on the first negative photosensitive resist, the second negative photosensitive resist through one of application and transfer;

applying a solvent onto the second negative photosensitive resist to partially mix the first negative photosensitive resist and the second negative photosensitive resist to form the compatible layer;

selectively subjecting the second negative photosensitive resist and the compatible layer to collective exposure to form a latent image of an ink ejection orifice pattern; and subjecting the first negative photosensitive resist, the second negative photosensitive resist, and the compatible layer to collective development to form an ink flow path and the ink ejection orifice.

3. The method of producing an ink ejection head according to claim 2, wherein an absolute value of a difference in solubility parameter (SP value) between the second negative photosensitive resist and the solvent is 3.0 or less.

4. The method of producing an ink ejection head according to claim 2, wherein the solvent has a boiling point of 220° C. or less.

5. The method of producing an ink ejection head according to claim 2, wherein:

the second negative photosensitive resist contains a solvent; and a boiling point of the solvent to be applied onto the second negative photosensitive resist comprises a temperature equal to or lower than a boiling point of the solvent in the second negative photosensitive resist.

6. the method of producing an ink ejection head according to claim 2, wherein:

the second negative photosensitive resist contains a solvent; and the solvent is identical to the solvent to be applied onto the second negative photosensitive resist.

7. The method of producing an ink ejection head according to claim 1, wherein the method comprises:

forming, on the substrate, the first negative photosensitive resist through one of application and transfer;

selectively exposing the first negative photosensitive resist to form a latent image of an ink flow path pattern;

forming, on the first negative photosensitive resist, the second negative photosensitive resist through one of application and transfer;

applying a third material containing a solvent onto the second negative photosensitive resist to partially mix the first negative photosensitive resist and the second negative photosensitive resist to form the compatible layer;

selectively subjecting the second negative photosensitive resist, the third material, and the compatible layer to collective exposure to form a latent image of an ink ejection orifice pattern; and subjecting the first negative photosensitive resist, the second negative photosensitive resist, the third material, and the compatible layer to collective development to form an ink flow path and the ink ejection orifice.

8. The method of producing an ink ejection head according to claim 7, wherein the third material has water repellency.

9. The method of producing an ink ejection head according to claim 7, wherein a ratio of the solvent in the third material is 5 mass % or more and 70 mass % or less.

10. The method of producing an ink ejection head according to claim 1, wherein sensitivity of the second negative photosensitive resist to exposure is higher than sensitivity of the first negative photosensitive resist to exposure.

* * * * *